United States Patent [19]

Nakamura et al.

[11] Patent Number: 5,309,345

[45] Date of Patent: * May 3, 1994

[54] INVERTOR DEVICE

[75] Inventors: Masashi Nakamura; Motohiro Shimizu, both of Wako, Japan

[73] Assignee: Honda Giken Kogyo Kabushiki Kaisha, Tokyo, Japan

[ * ] Notice: The portion of the term of this patent subsequent to Nov. 24, 2009 has been disclaimed.

[21] Appl. No.: 790,470

[22] Filed: Nov. 12, 1991

[30] Foreign Application Priority Data

Nov. 13, 1990 [JP] Japan ................. 2-307823
Jun. 12, 1991 [JP] Japan ................. 3-167542

[51] Int. Cl.$^5$ ........................... H02M 7/525
[52] U.S. Cl. ........................ 363/41; 363/98; 363/132
[58] Field of Search ............. 363/98, 132, 39–41, 363/95, 131, 56, 97

[56] References Cited

U.S. PATENT DOCUMENTS

| | | | |
|---|---|---|---|
| 3,859,586 | 1/1975 | Wadlington | 321/18 |
| 4,626,979 | 12/1986 | Jaquay | 363/41 |
| 4,816,981 | 3/1989 | Nishihiro et al. | 363/37 |
| 4,947,310 | 8/1990 | Kawabata et al. | 363/71 |
| 5,068,777 | 11/1991 | Ito | 363/97 |
| 5,093,611 | 3/1992 | Nakamura et al. | 322/90 |
| 5,105,352 | 4/1992 | Iwasa et al. | 363/98 |
| 5,166,870 | 11/1992 | Shimizu et al. | 363/41 |

FOREIGN PATENT DOCUMENTS

| | | |
|---|---|---|
| 59-132398 | 9/1984 | Japan . |
| 60-82098 | 5/1985 | Japan . |
| 63-167677 | 7/1988 | Japan . |
| 3-26300 | 3/1991 | Japan . |
| 3-93499 | 4/1991 | Japan . |

Primary Examiner—Steven L. Stephan
Assistant Examiner—Adolf Berhane
Attorney, Agent, or Firm—Frishauf, Holtz, Goodman & Woodward

[57] ABSTRACT

An invertor device for an AC power unit. In one form of the invention, a sine wave signal having a predetermined frequency is superposed on a triangular wave signal having a frequency higher than the predetermined frequency to form a superposed signal. A pulse width modulating circuit having a predetermined fixed threshold level amplifies the superposed signal with reference to the predetermined fixed threshold level to generate a pulse width modulalted signal. A switching device performs switching control of an output from a DC power source circuit based on the pulse width modulated signal to output an AC power having the predetermined frequency via an output circuit. In another form of the invention, a difference between waveforms of output AC voltages appearing at output terminals of the output circuit is detected to generate a signal representing the difference. The sine wave signal is corrected by the use of the signal representing the difference and the corrected sine wave signal is used in forming the pulse width modulated signal. Alternatively, a difference between voltages of switched outputs from the switching device which are transmitted to the output circuit by a pair of output lines is detected to generate a signal representing the difference for use in correcting the sine wave signal. In another form of the invention, the sine wave signal is additionally corrected by the use of DC offset components taken out from the signal representing the difference.

16 Claims, 11 Drawing Sheets

INVERTOR DEVICE

CROSS REFERENCE TO RELATED APPLICATION

This application is related to U.S. patent application Ser. No. 07/777,079 filed Oct. 16, 1991, now U.S. Pat. No. 5,166,870.

BACKGROUND OF THE INVENTION

1. Field of the Invention

This invention relates to an invertor device for AC power units, and more particularly to an invertor device of the pulse width-modulation type for use in portable AC power units.

2. Prior Art

In recent years, portable AC power units have been increasing in number which are equipped with invertor devices for stabilizing the output frequency. For example, a portable power unit which generates AC power having a commercial frequency by means of an AC generator driven by an engine is known, e.g. by Japanese Provisional Utility Model Publication (Kokai) No. 59-132398, in which the engine is operated within a high speed range to cause the AC generator to generate high AC output, the output is converted into direct current, then the direct current is converted into alternating current by an invertor device, and the alternating current is outputted.

In the meanwhile, there is a demand for AC power units of this kind whose output waveform is as close to a sine wave dependent upon their application as possible. To this end, an attempt has been made to employ an invertor device of the pulse width-modulation type as the above-mentioned invertor device (Japanese Provisional Patent Publication (Kokai) No 60-82098).

According to this publication, a sine wave signal which determines the output frequency and the output voltage is compared with a triangular wave signal as a modulation carrier by a comparator, and a pulse width-modulated signal having a pulse width dependent upon the comparison result is supplied to the invertor device for switching control thereby.

To make the waveform of the output from the AC power unit using the invertor device of the pulse width modulation type closer to that of a sine wave, the frequency of the modulation carrier (the frequency of the triangular wave signal) is required to be as high as possible. However, the operating speed of the above invertor is limitted by the response time of the comparator, which is usually approximately 1 μsecond, so that it is difficult to increase the frequency of the modulation carrier, which prevents the output waveform from becoming closer to that of a sine wave.

Further, in such AC power units as described above, generally, the output voltage is detected, and feedback control is performed based on the detected output voltage to maintain the output voltage at a predetermined value. For example, as disclosed in Japanese Provisional Patent Publication (Kokai) No. 63-167677, the output voltage is detected by means of a transformer, and the feedback control is performed based on the detected output voltage, or alternatively, an RC filter is connected to the input of an output circuit which provides the output voltage and comprises a low-pass filter, and the output voltage is detected via the RC filter so that the feedback control is performed based on the invertor output voltage detected via the RC filter.

However, according to the former conventional method of detecting the output voltage by means of the transformer, if the output voltage is offset, it is impossible to detect an offset component, and hence it is impossible to feedback-control the output voltage such that the offset component is eliminated. On the other hand, the latter method in which the invertor output voltage is detected via the RC filter requires to provide insulating transfer means, modulating transfer means, etc. to take out an accurate feedback signal from the detected voltage, which makes complicated the processing of the feedback signal to reduce or eliminate distortions in the feedback signal or a residual offset component therein.

SUMMARY OF THE INVNETION

It is a first object of the invention to provide an invertor device for an AC power unit, which is capable of generating AC power having a waveform closer to that of a sine wave than the waveform of AC power supplied by conventional invertor devices.

It is a second object of the invention to provide an invertor device for an AC power unit, which is capable of accurately correcting distortion in the waveform of the output voltage from the unit and a dc offset component thereof.

To attain the first object, according to a first aspect of the invention, there is provided an invertor device for an alternating current power unit having a direct current power source circuit, the invertor device including switching means for effecting switching control of an output from the direct current power source circuit, and an output circuit responsive to the switching control of the switching means for supplying an AC power output.

The invertor device accoording to the first aspect of the invention is characterized by comprisisng:

a sine wave-forming circuit for generating a sine wave signal having a predetermined frequency;

a triangular wave-forming circuit for generating a triangular wave signal having a frequency higher than the predetermined frequency;

a superposed signal-forming circuit for superposing the triangular wave signal on the sine wave signal to generate a superposed signal; and a pulse width modulating circuit having a predetermined fixed threshold level for amplifying the superposed signal with reference to the predetermined fixed threshold level to generate a pulse width modulated signal;

wherein the switching means performs the switching control based on the pulse width modulated signal from the pulse width modulating circuit.

Preferably, the pulse width modulating circuit comprises an invertor buffer having the predetermined fixed threshold level.

More preferably, the invertor buffer is formed of an integrated circuit, an input terminal thereof having a threshold level of a C-MOS gate.

Also preferably, the triangular wave-forming circuit comprises a rectangular wave-forming circuit for generating a rectangular wave signal having the frequency higher than the predetermined frequency, and an integrating circuit for integrating the rectangular wave signal to form the triangular wave signal.

Further preferably, the rectangular wave signal has a repetition period longer than the response time of the invertor buffer.

Preferably, the invertor device includes a shift-detecting circuit for detecting an amount of shift in a direct current component in an output voltage from the output circuit, and a shift feedback control circuit responsive to the amount of shift detected by the shift-detecting circuit for changing an amplitude reference level of the sine wave signal so as to decrease the amount of shift, to thereby feedback-control the pulse width modulated signal.

To attain the first and second objects of the invention, according to a second aspect of the invention, there is provided an invertor device for an alternating current power unit having a direct current power source circuit the invertor device including switching means for effecting switching control of an output from the direct current power source circuit, a sine wave-forming circuit for generating a sine wave reference signal having a predetermined frequency, a pulse width modulating circuit for subjecting the sine wave reference signal to pulse width modulation to generate a pulse width modulated signal, a switching control circuit for causing the switching means to perform the switching control based on the pulse width modulated signal from the pulse width modulating circuit, and an output circuit having a pair of output terminals and responsive to the switching control by the switching means for generating an alternating current power output having a sinusoidal waveform via the output terminals.

The invertor device according to the second aspect of the invention is characterized by comprising:

a detecting circuit for comparing between waveforms of output alternating current voltages appearing at the output terminals and effecting differential amplification of the output voltages, to thereby detect a difference between the waveforms of the output alternating current voltages and generate a signal representing the difference; and a correcting circuit for correcting the sine wave reference signal by the signal from the detecting circuit and then supplying the resulting corrected sine wave reference signal to the pulse width modulating circuit, to thereby correct the waveforms of the output alternating current voltages appearing at the output terminals such that the alternating current power output has a waveform closer to that of a sine wave.

Preferably, the detecting circuit comprises a constant voltage supply source, first and second voltage-dividing resistances connected between the constant voltage supply source and respective ones of the output terminals, a differential amplifier having a pair of input terminals connected to the first and second voltage-dividing resistances to be supplied with respective divided voltages therefrom, and filter means for removing high frequency components from the divided voltages.

Also preferably, the invertor device comprises a triangular wave-forming circuit for generating a triangular wave signal having a frequency higher than the predetermined frequency of the sine wave reference signal, and a superposed signal-forming circuit for superposing the triangular wave signal on the sine wave reference signal from the correcting circuit to form a superposed signal and supply the superposed signal to the pulse width modulating circuit, and the pulse width modulating circuit comprises an amplifier circuit having a predetermined fixed threshold level, the amplifier circuit amplifying the superposed signal from the superposed signal-forming circuit to thereby generate the pulse width modulated signal.

More preferably, the correcting circuit comprises a differential amplifier for comparing the sine wave reference signal with the signal from the detecting circuit and amplifying a difference therebetween.

To attain the first and second objects of the invention, according to a third aspect of the invention, there is provided an invertor device for an alternating current power unit having a direct current power source circuit, the invertor device including switching means for effecting switching control of an output from the direct current power source circuit to generate a pair of switched outputs, a sine wave-forming circuit for generating a sine wave reference signal having a predetermined frequency, a pulse width modulating circuit for subjecting the sine wave reference signal to pulse width modulation to generate a pulse width modulated signal, a switching control circuit for causing the switching means to perform the switching control based on the pulse width modulated signal from the pulse width modulating circuit, a pair of output lines connected to an output of the switching means for transmitting the pair of switched outputs from the switching means, a filter circuit connected to the pair of output lines for converting the pair of switched outputs into an alternating current power output having a sinusoidal waveform, and a pair of output terminals connected to the filter circuit for outputting the alternating current power output from the filter circuit.

The invertor device according to the third aspect of the invention is characterized by comprising:

a detecting circuit connected to the pair of output lines for comparing between voltages of the pair of switched outputs and effecting differential amplification of the voltages, to thereby detect a difference between the output voltages and generate a signal representing the difference; and a correcting circuit for correcting the sine wave reference signal by the signal from the detecting circuit and then supplying the resulting corrected sine wave reference signal to the pulse width modulating circuit, to thereby correct, waveforms of output alternating current voltages appearing at the pair of output terminals such that the alternating current power output has a waveform closer to that of a sine wave.

Preferably, the filter circuit comprises a first low-pass filter circuit formed of a coil and a capacitor, and the detecting circuit comprises a second low-pass filter circuit formed of resistances and capacitors removing high frequency components from the pair of switched outputs at the pair of output lines and a differential amplifier for comparing between filtered output voltages from the second low-pass filter circuit and amplifying a difference between the output voltages.

To attain the first and second objects of the invention, according to a fourth aspect of the invention, there is provided an invertor device for an alternating current power unit having a direct current power source circuit, the invertor device including switching means for effecting switching control of an output from the direct current power source circuit to generate a pair of switched outputs, a sine wave-forming circuit for generating a sine wave reference signal having a predetermined frequency, a pulse width modulating circuit for subjecting the sine wave reference signal to pulse width modulation to generate a pulse width modulated signal, a switching control circuit for causing the switching means to perform the switching control based on the pulse width modulated signal from the pulse width modulating circuit, a pair of output lines connected to an output of the switching means for transmitting the pair of switched outputs from the switching means, and an output circuit connected to the pair of output lines for converting the pair of switched outputs into alternating current power output having a sinusoidal waveform and supplying the alternating current power output.

The invertor device according to the fourth aspect of the invention is characterized by comprising:

a detecting circuit connected to the pair of output lines for detecting a relative voltage difference therebetween and forming a relative voltage difference signal;

a first waveform-correcting circuit for taking out and amplifying a direct current offset component from the relative voltage difference signal for feeding back the direct current offset component to the sine wave reference signal to thereby perform offset correction thereof; and a second waveform-correcting circuit for feeding back an alternating current component of the relative voltage difference signal to the sine wave reference signal to correct and supply the sine wave reference signal to the pulse width modulating circuit, to thereby correct, in a feedback manner, the waveform of the alternating current power output such that the alternating current power output has a waveform closer to that of a sine wave.

The above and other objects, features, and advantages of the invention will be more apparent from the ensuing detailed description taken in conjunction with the accompanying drawings.

DETAILED DESCRIPTION

The invention will now be described in detail with reference to the drawings showing embodiments thereof.

Figure 1A:
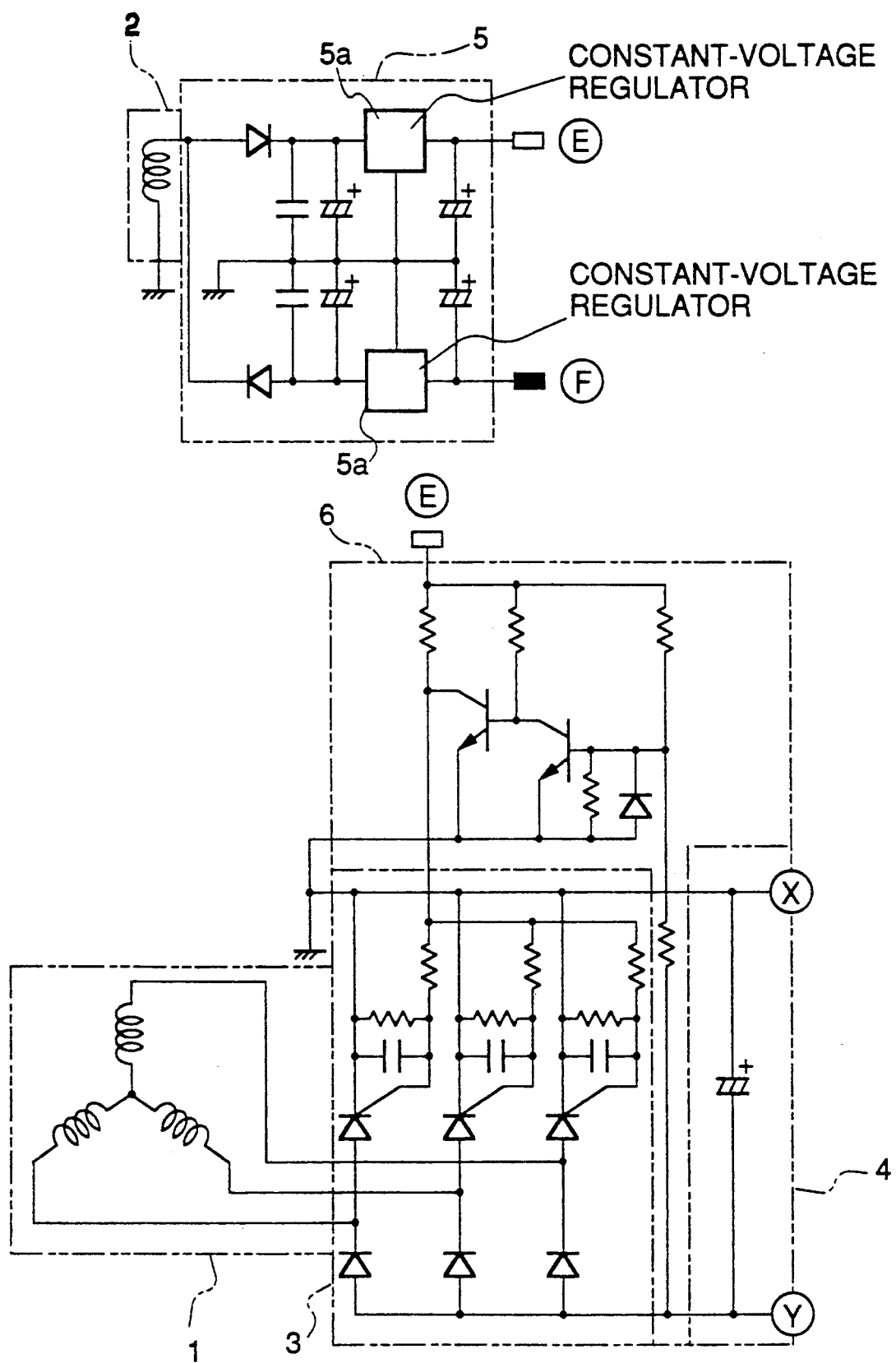
FIG. 1a is a circuit diagram showing component parts of a portable AC power unit including a three-phase output winding, a single-phase auxiliary winding, a bridge rectifier, a smoothing circuit, a constant-voltage regulator circuit, and a thyristor control circuit.

Referring first to FIGS. 1a to 1e, there is shown the whole arrangement of a portable AC power unit incorporating an invertor device according to a first embodiment of the invention. In FIG. 1a, reference numerals 1 and 2 designate respectively a three-phase output winding and a single-phase auxiliary winding (control winding) wound on a common stator core, not shown, of an AC generator, separately from each other.

A magnet rotor, not shown, having a plurality of magnetic poles is arranged to be rotatively driven by an engine, not shown. The three-phase output winding 1 has its output connected to a bridge rectifier 3 comprised of three thyristors and three diodes, which in turn has its output connected to a smoothing circuit 4. The bridge rectifier 3 and the smoothing circuit 4 cooperatively form a direct current power source circuit.

The single-phase auxiliary winding 2 has its output connected to a constant-voltage regulator circuit 5 having positive and negative output terminals E and F. The constant-voltage regulator circuit 5 has two sets of rectifiers, smoothing circuits, and constant-voltage regulators 5a, one set being operable in response to current flowing in one direction from the auxiliary winding 2, the other set in response to current flowing in the other direction from the winding 2 so that the output terminals E, F supply positive constant voltage and negative constant voltage, respectively.

Reference numeral 6 designates a thyristor control circuit which has a power source-input terminal connected to the positive output terminal E of the constant-voltage regulator circuit 5, and another terminal grounded together with a positive terminal of the smoothing circuit 4. The thyristor control circuit 6 has a signal-input terminal connected to a negative terminal of the smoothing circuit 4, and a signal-output terminal connected to gate input circuits of the thyristors of the bridge rectifier 3.

With the above arrangement, three-phase alternating current from the three-phase output winding 1 is rectified by the bridge rectifier 3, and smoothed into direct current voltage by the smoothing circuit 4. Fluctuations in the direct current voltage from the smoothing circuit 4 are detected by the thyristor control circuit 6 to thereby control turning-on and -off of the thyristors of the bridge rectifier so that the output voltage from the smoothing circuit 4 can be stably maintained in feedback manner.

Details of the above control by the thyristor control circuit are disclosed in Japanese Provisional Patent Publication Kokai) No. 3-93499 and Japanese Provisional Utility Model Publication (Kokai) No. 3-26300.

Figure 1B:
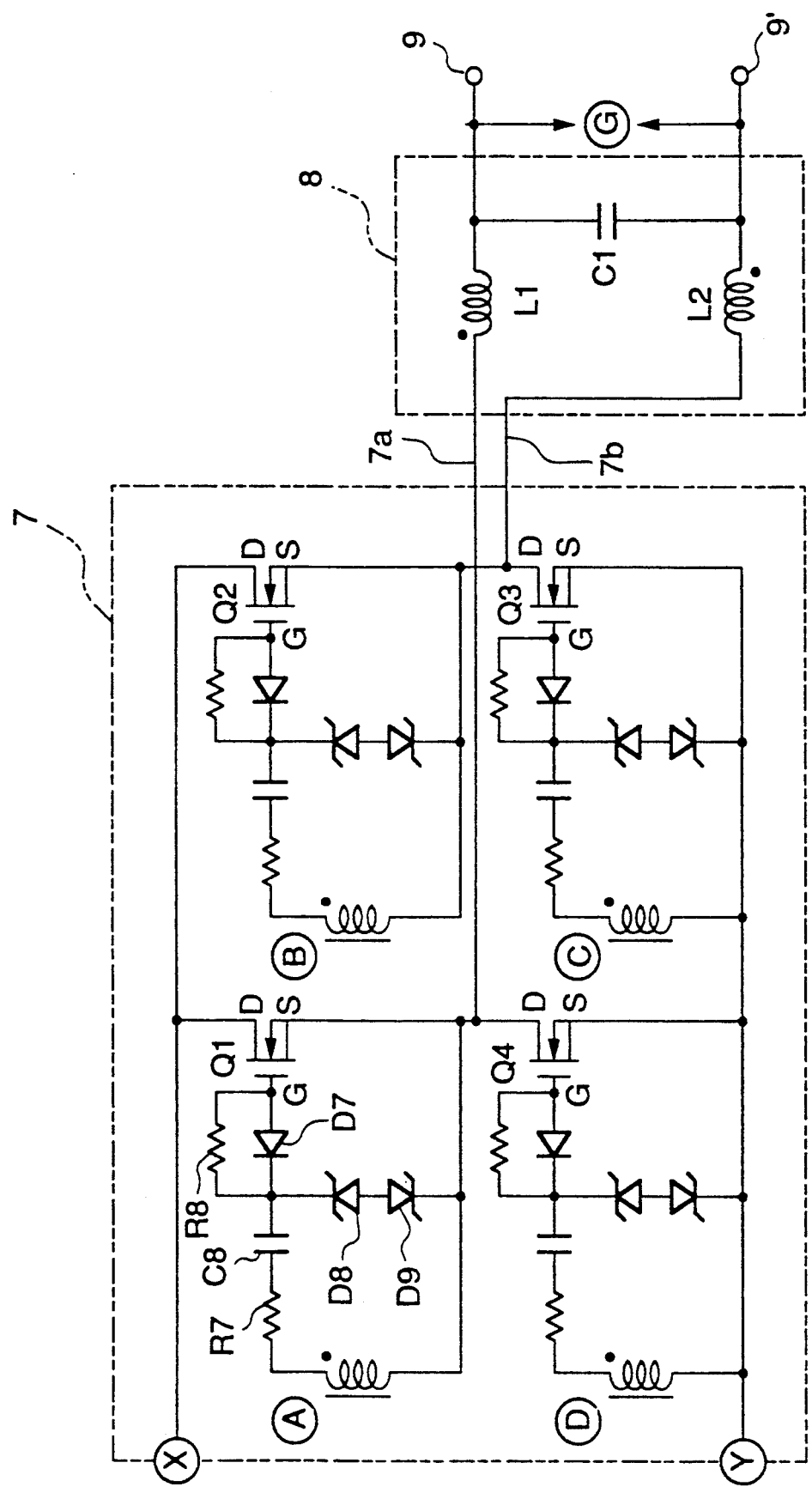
FIG. 1b is a circuit diagram showing an invertor and an output circuit, forming part of an invertor device as a component of the portable AC power unit according to a first embodiment of the invention.

Next, the invertor device will be described with reference to FIG. 1b.

The smoothing circuit 4 has its output connected to an invertor 7. The invertor 7 is formed by a bridge circuit composed of four FET's (field effect transistors) Q1-Q4 as switching elements which have their gates connected to a driving signal circuit, hereinafter referred to.

The junction between the FET's Q1 and Q4 and the junction between the FET's Q2 and Q3 are connected respectively to output terminals 9 and 9' via output lines 7a, 7b and a low-pass filter (output circuit) 8. A load, not shown, is to be connected to the output terminals 9, 9'. The low-pass filter 8 is formed of coils L1 and L2 connected in series to the load, and a capacitor C1 connected in parallel with the load, and acts to pass low frequency components (commercial frequency components in the present embodiment) in the output from the invertor 7 to thereby supply commercial frequency output power to the load through the output terminals 9, 9'.

Figure 1C:
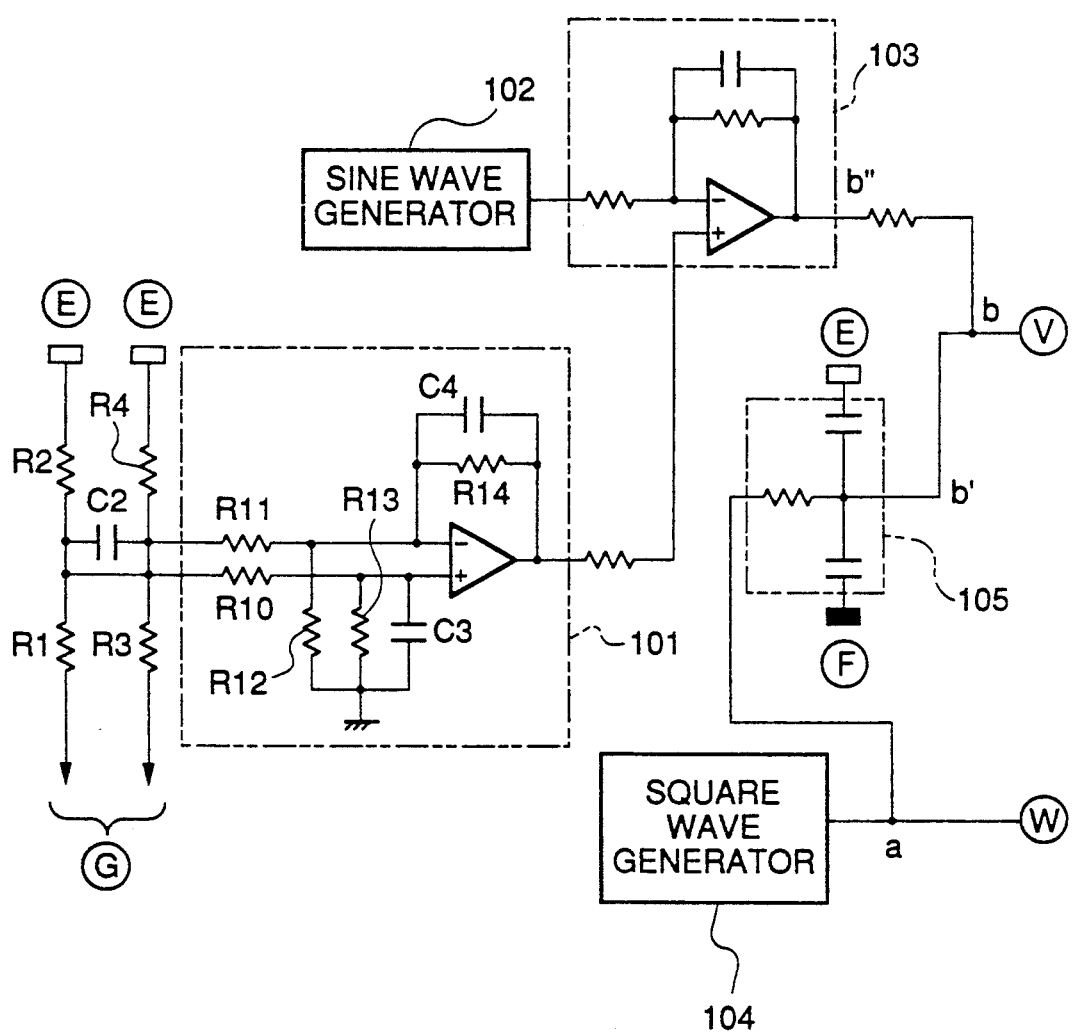
FIG. 1c is a circuit diagram showing a detecting circuit, a sine wave generator, a differential amplifier, a square wave generator, and an integrating circuit, forming part of the invertor device according to the first embodiment of the invention.

The capacitor C1 of the low-pass filter B has its opposite ends G connected respectively to ends of series circuits formed by resistances R1 and R2, and R3 and R4, shown in FIG. 1c. The other ends of these series circuits are connected to the positive output terminal E of the constant-voltage regulator circuit 5. The junction between the resistances R1, R2 and the junction between the resistances R3, R4 are connected respectively to a positive input terminal and a negative input terminal of a differential amplifier 101 through respective resistances R10 and R11, with a capacitor C2 for cutting off high frequency components connected between the two junctions. The differential amplifier 101 comprises an operational amplifier which has the positive input terminal grounded via a capacitor C3 for cutting off high frequency components. The resistances R1-R4, capacitor C2 and differential amplifier 101 cooperate to form a detecting circuit which detects an amount of shift of the direct current component in the output voltage.

In FIG. 1c, reference numeral 102 designates a sine wave generator which generate a sine wave signal having a commercial frequency, e.g. 50Hz or 60Hz. The output of the sine wave generator 102 is connected to a negative input terminal of a differential amplifier (correction circuit) 103, while the output of the differential amplifier 101 is connected to a positive input terminal of the differential amplifier 103.

Reference numeral 104 designates a square wave generator which generates a square wave signal having a pulse repetition period which is longer than the response time of an invertor buffer 106, hereinafter referred to, which is approximately 50 nsec. The value of approximately 50 nsec is the lower limit value of time within which the invertor buffer can respond to an input thereto. Although the pulse repetition period of the square wave signal is limited by the value of approximately 50 nsec, it is by far shorter than the response time of approximately 1 $\mu$sec of a conventional comparator. Therefore, the frequency of the square wave signal can be set to a frequency by far higher than the frequencies of conventional PWM carrier waves (triangular waves).

The output of the square wave generator 104 is connected to an integrating circuit 105 which has its output connected to the output of the differential amplifier 103 such that the two circuits 105, 103 cooperatively form a superposed signal creating circuit. The two connected outputs are connected to the input of the invertor buffer 106 shown in FIG. 1d The invertor buffer 106 is formed by an amplifier with a predetermined fixed threshold level which operates such that when a signal having a level exceeding the threshold level is inputted, it outputs an amplified low level signal, while when a signal having a level below the threshold value is inputted, it outputs an amplified high level signal. The invertor buffer 106 may be formed by an IC device designed for use as a buffer having a fixed threshold level relative to its gate input level, such as a C-MOS gate. The output of the invertor buffer 106 is connected to an input terminal of a NAND circuit 107.

The output of the square wave generator 104 is connected to a differentiation circuit 110 via an invertor buffer 108, and further to a differentiation circuit 111 via a dual invertor buffer 109. The differentiation circuit 110 is composed of a coupling capacitor C4 connected between the output of the invertor buffer 108 and the output of the circuit 110, and a parallel circuit formed by a diode D1 with its anode connected to the negative output terminal F and a resistance R5. The other differentiation circuit 111 has just the identical configuration with the differentiation circuit 110 and is composed of a coupling capacitor C5, a diode D2, and a resistance R6.

The output of the differentiation circuit 110 is connected to the other input terminal of the NAND circuit 107 via an invertor buffer 112. The output of the NAND circuit 107 is connected to one input terminal of a NAND circuit 114 which has another input terminal connected to the output of the differentiation circuit 111 via an invertor buffer 113.

Figure 1D:
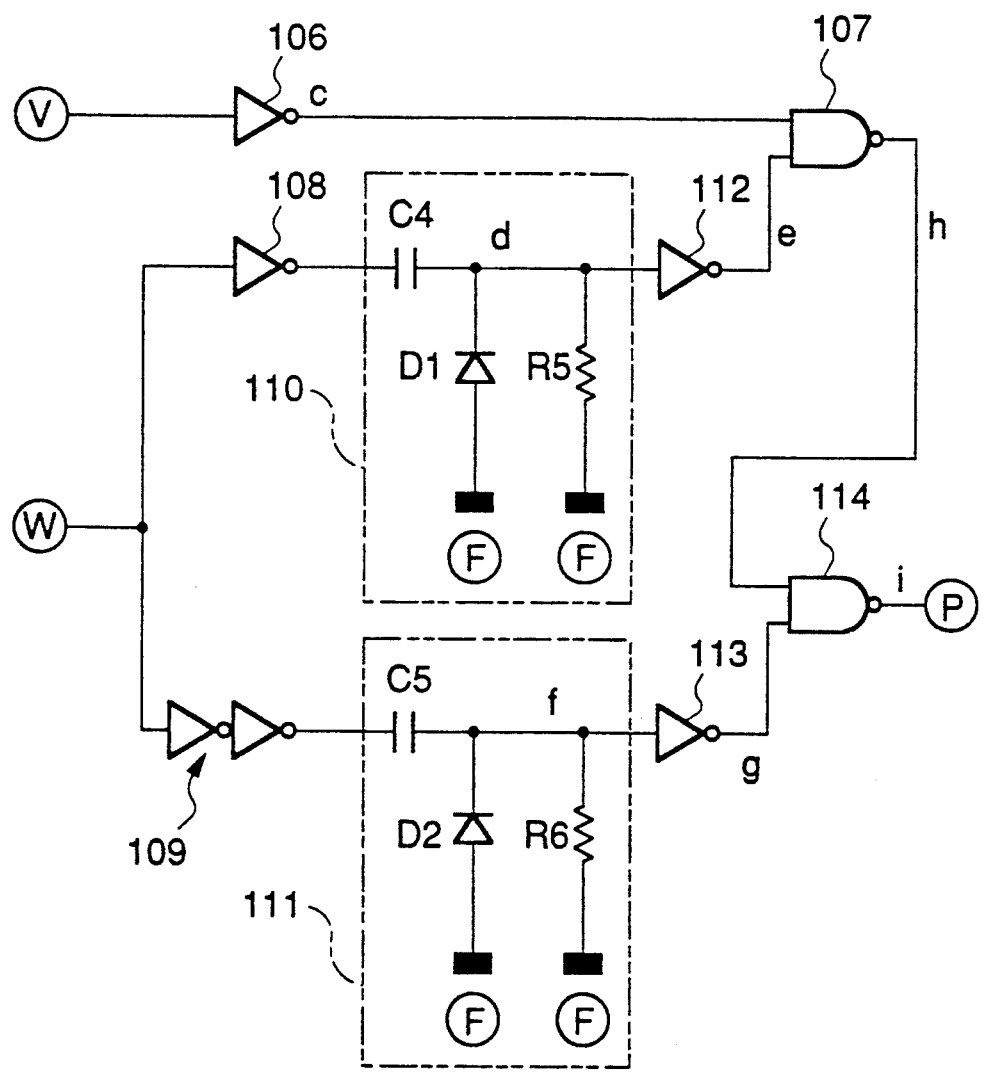
FIG. 1d is a circuit diagram showing invertor buffers, differentiation circuits, etc., forming part of the invertor device according to the first embodiment of the invention.
Figure 1E:
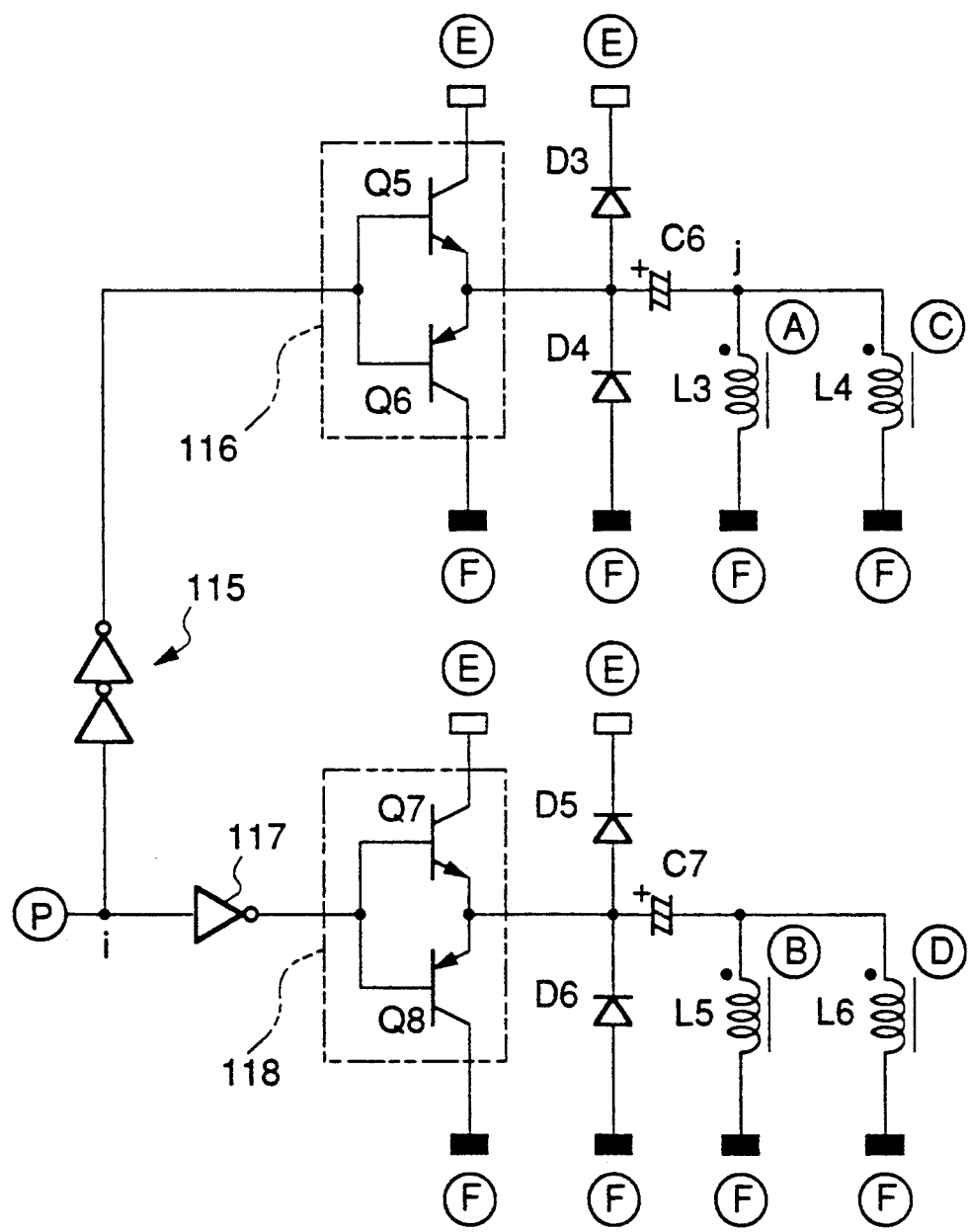
FIG. 1e is a circuit diagram showing a push-pull amplifier etc., forming part of the invertor according to the first embodiment of the invention.

The output of the NAND circuit 114 is connected via a dual invertor buffer 115 shown in FIG. 1e to a push-pull amplifier 116 composed of transistors Q5 and Q6. The transistor Q5 of the push-pull amplifier 116 has its collector connected to the positive output terminal of the constant-voltage regulator circuit 5, and the transistor Q6 has its collector connected to the negative output terminal F of the constant-voltage regulator circuit 5.

The output of the push-pull amplifier 116, i.e. the junction between emitters of the transistors Q5, Q6 is connected to the junction of an anode of a diode D3 and a cathode of a diode D4. The diode D3 has its cathode connected to the positive output terminal E of the constant-voltage regulator circuit 5, and the diode D4 has its anode connected to the negative output terminal F of the regulator circuit 5. The diodes D3, D4 cooperate to damp surging occurring at pulse transformers, hereinafter referred to.

The junction between the anode of the diode D3 and the cathode of the diode D4 is connected to ends of primary coils L3 and L4 of pulse transformers A, C via a capacitor C6 for cutting off low frequency components. The other ends of the primary coils L3, L4 are connected to the negative output terminal F of the constant-voltage regulator circuit 5. The capacitor C6 has such a constant as passes only the PWM carrier frequency signal which has a relatively high frequency and cuts off low frequency components.

The output of the NAND circuit 114 is connected by way of an invertor buffer 117 shown in ie to a push-pull amplifier 118 composed of transistors Q7 and Q6 like the push-pull amplifier 116, and its output is connected to the junction between an anode of a diode D5 and a cathode of a diode D6. This junction is connected to ends of primary coils L5 and L6 of pulse transformers B and D via a capacitor C7 which has such a constant as passes only the PWM carrier frequency signal and cuts off low frequency components like the capacitor C6.

Referring again to FIG. 1b, the driving signal circuit which is connected to gates of the FET's Q1–Q4 will be described. One end of the secondary coil of the pulse transformer A is connected to a gate of the FET Q1 via a series circuit formed by a damping resistance R7, and a demodulating capacitor C8, and a parallel circuit formed by a resistance R8 and a diode R7, while the other end of the secondary coil of the pulse transformer A is connected to a source of the FET Q2. The junction between the capacitor C8, and the parallel circuit formed by the resistance R8 and the diode D7 is connected to the above other end of the secondary coil of the pulse transformer A via Zener diodes D8 and D9. The diode D7 has its anode connected to the gate of the FET Q1, and the Zener diodes D8, D9 have their anodes connected with each other.

Provided between a secondary coil of each of the pulse transformers B, C and D and a gate of a corresponding one of the FET's Q2–Q4 is the same circuitry as the above described one provided between the secondary coil of the pulse transformer A and the gate of the FET Q1.

The operation of the invertor device comprised of the invertor 7, the low-pass filter 8, and the circuitry of FIGS. 1c to 1e) will be described in detail with reference to signal waveforms shown in FIG. 2 through FIG. 5:

The FET's Q1, Q3 and the FET's Q2, Q4 have their gates supplied with a pulse width-modulated (PWM) signal, hereinafter referred to, so that the FET's Q1, Q3 are caused to conduct alternately, and so do the FET's Q2, Q4 to effect switching control of the output from the smoothing circuit 4. The switch-controlled output is applied to the low-pass filter 8 where high requency components thereof are removed. The output from the low-pass filter 8 is supplied through the output terminals 9, 9' to the load as commercial frequency AC power.

The waveforms of output voltage from the output terminals 9 and one from the output terminal 9' are fed through the dividing resistances R1, R2, and R3, R4 and are compared with each other by the differential amplifier 101, which detects the difference between the two waveforms as an AC signal, which is indicative of a distortion and/or offset component(s) in the output voltage, and amplifies same. The output from the differential amplifier 10 is fed to the differential amplifier 103. By thus directly comparing between the waveforms of output voltage at the output terminals 9, 9', distortion in the output voltage waveform can be detected with high accuracy. The capacitors C2, C3 act to remove high frequency components from the differential signal, and the capacitor C3 also removes disturbances applied to the differential amplifier 103.

Figure 2:
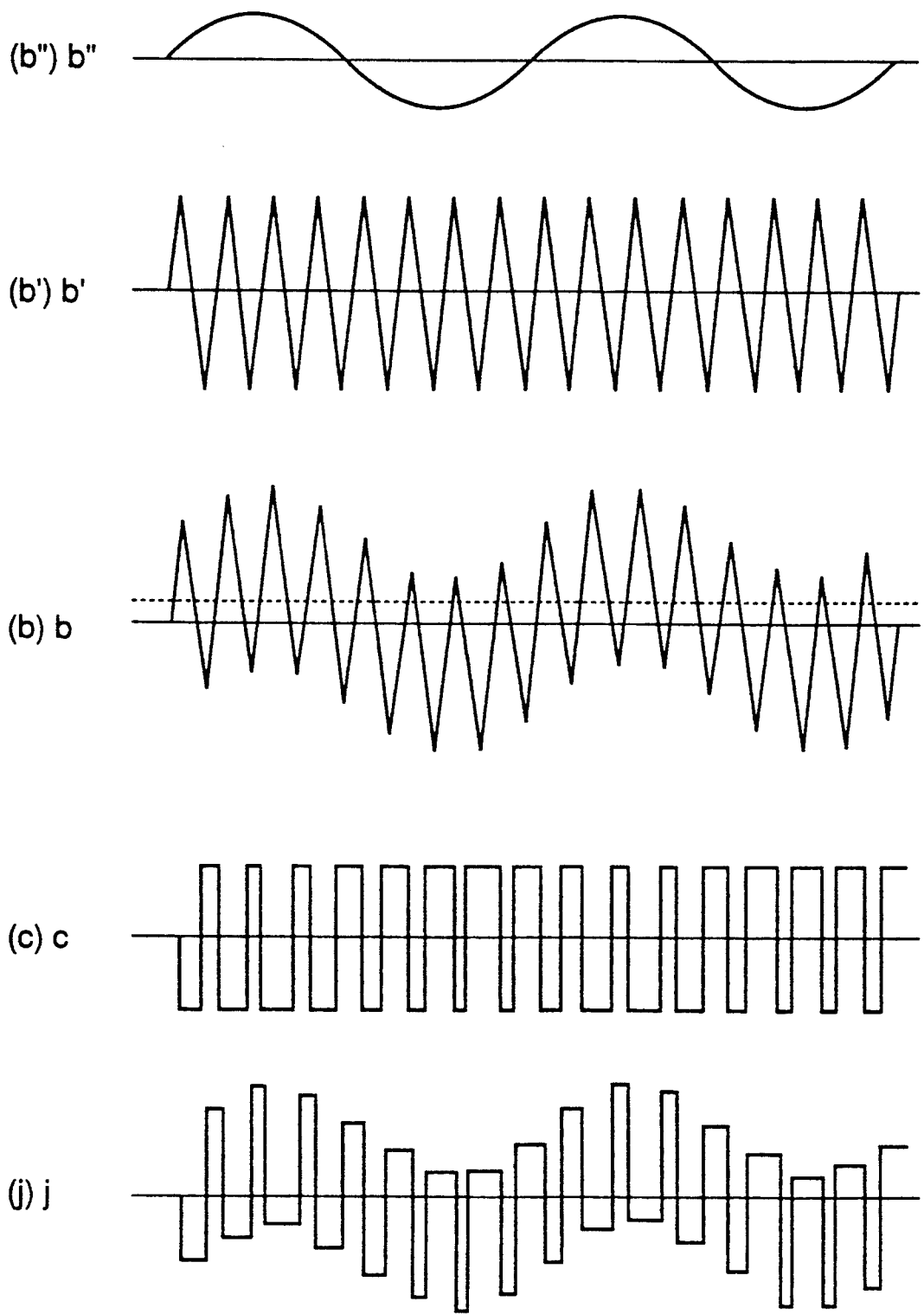
FIG. 2 is a timing chart showing signal waveforms at different points in the invertor device.

The differential amplifier 103 compares the sine wave signal having a commercial frequency from the sine wave generator 102 with the AC feedback signal indicative of a distortion and/or DC offset component(s) in the output voltage outputted from the differential amplifier 101, and outputs a sine wave signal b'' having the commercial frequency, which has its amplitude reference level corrected by the feedback signal, as appearing at (b'') in FIG. 2. Since the PWM signal is created based upon this corrected sine wave signal as described hereinafter, it is possible to reduce distortion and DC offset components in the waveform of the output voltage attributed to variations in the threshold level of the invertor buffer 106, variations in the temperature characteristics of various component parts, etc., to thereby make the output waveform closer to that of the sine wave.

Figure 3:
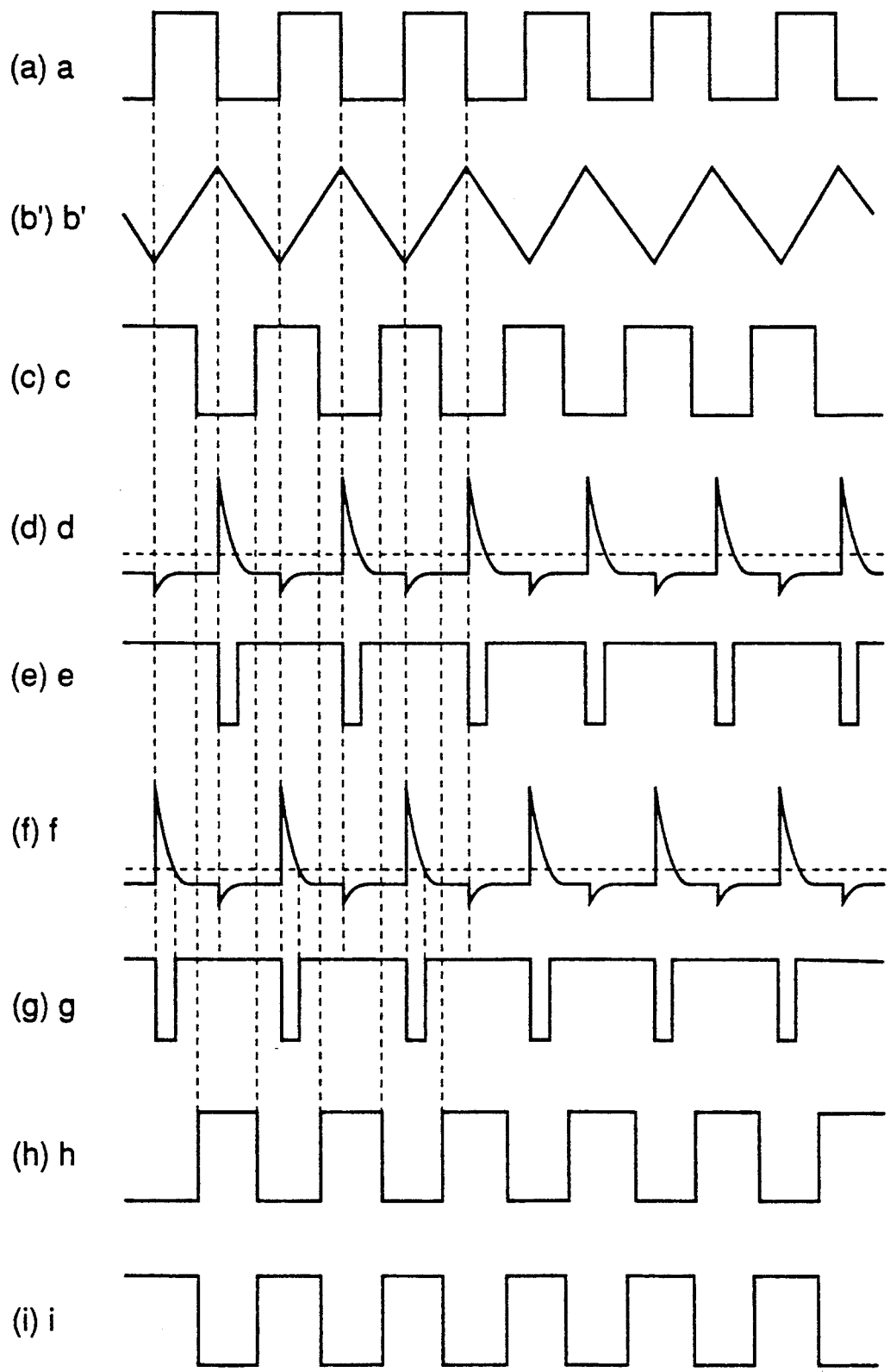
FIG. 3 is a timing chart showing signal waveforms at various points in the invertor device.

The square wave signal a in FIG. 3 from the square wave generator 104 is integrated by the integrating circuit 105 into a triangular wave signal b' appearing at (b') in FIG. 2 and (b') in FIG. 3. This triangular wave signal b' is superposed upon the corrected sine wave signal b'' from the differential amplifier 103 into a superposed signal b appearing at (b) in FIG. 2, which is supplied to the invertor buffer 106. The invertor buffer 106 operates to generate a low level output when supplied with an input having a level exceeding its threshold level indicated by the broken line at (b) in FIG. 2, and generate a high level output when supplied with an input having a level below the threshold level, as shown at (c) in FIG. 2.

The resulting pulse train signal c from the invertor buffer 106 is a pulse width-modulated (PWM) signal obtained by pulse width modulation by the sine wave signal b'' with the triangular signal b' as the carrier wave. Then, how this PWM signal c will be processed into an output signal i from the NAND circuit 114 will now be explained. For the convenience of explanation, the PWM signal is shown in a simplified form having a constant pulse width as shown at (c) in FIG. 3.

The square wave signal a (at (a) in FIG. 3) from the square wave generator 104 is inverted by the invertor buffer 108, followed by differentiation at the differentiation circuit 110 into a signal d appearing at (d) in FIG. 3. Specifically, whenever the square wave signal a at (a) in FIG. 3 falls, the capacitor C4 is charged through the resistance R5 so that a positive pulse appears as shown at (d) in FIG. 3, while whenever the square wave signal rises, the capacitor C4 is discharged through the diode D1 so that a negative pulse appears as shown at (d) in FIG. 3.

The output signal d from the differentiation circuit 110 is inverted by the invertor buffer 112 with respect to its threshold level indicated by the broken line at (d) in FIG. 3, into a signal e as shown at (e) in FIG. 3. The output signal e from the invertor buffer 112 and the output signal c at (c) in FIG. 3 from the invertor buffer 106 are applied to the NAND circuit 107, which is responsive to the input signals to generate a signal h as shown at (h) in FIG. 3.

Further the square wave signal a at (a) in FIG. 3 from the square wave generator 104 is fed through the dual invertor buffer 109 and then differentiated by the differentiation circuit 111 into a signal f as shown at (f) in FIG. 3. The differentiated signal f is inverted by the invertor buffer 113 with respect to its threshold level indicated by the broken line at (f) in FIG. 3 into a signal g appearing at (g) in FIG. 3. Thus, the same signal processing is carried out by the differentiation circuit 111 and the invertor buffer 113 as that by the differentiation circuit 110 and the invertor buffer 112 described above.

The NAND circuit 114 is supplied with the output signal h at (h) in FIG. 3 from the NAND circuit 107 and the output signal g at (g) in FIG. 3 from the invertor buffer 113, to generate a signal i shown at (i) in FIG. 3.

Figure 4:
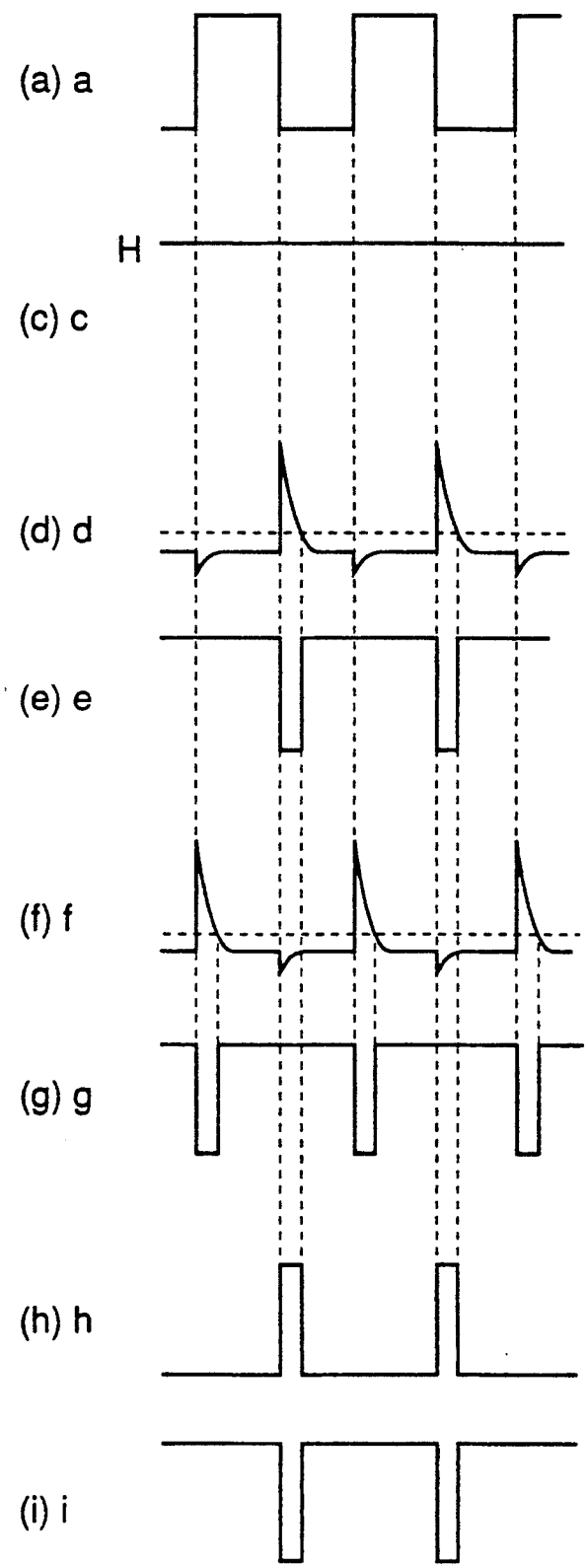
FIG. 4 is a timing chart showing signal waveforms at various points in the invertor device, obtained in the case where a failsafe operation is performed due to output from an invertor buffer in FIG. 1d being held at a high level.

As mentioned before, in case that distortions occur in the output voltage waveform due to a load connected to the output terminals 9, 9', etc., feedback control is carried out so as to make the output voltage waveform close to the sine waveform. However, when a large load such as an electric motor is connected to the output terminals 9, 9', a very large waveform distortion can occur, though temporarily. In such a case, the amplitude of the sine wave signal b'' at (b'') in FIG. 2 from the differential amplifier 103 is corrected by a large amount by the feedback signal from the differential amplifier 101 to such an extent that the amplitude of the sine wave signal becomes larger than that of the triangular wave signal. As a result, the superposed signal b at (b) in FIG. 2 continuously lies only on one side with respect to the threshold level indicated by the broken line in FIG. 2 (i.e. it does not cross the threshold level). Consequently, the output from the invertor buffer 106 is held at a high level (if the maximum level of the superposed signal continuously lies below the threshold level), or it is held at a low level (if the minimum level of the superposed signal continuously lies above the threshold level). That is, the output from the invertor buffer 106 becomes direct current to make it impossible to carry out signal transmission by the pulse transformers. To overcome this disadvantage, in the present embodiment, there are provided output signals from the invertor buffers 112, 113, which operate as follows:

For instance, if the output signal c from the invertor buffer 106 is held at a high level as at (c) in FIG. 4, the output signals from the invertor buffers 112, 113 regularly vary as usual, respectively as shown at (e) and (g) in FIG. 4, irrespective of the state of the output from the invertor buffer 106. Accordingly, the pulse width of the output signal from the NAND circuit 107 is limited by the pulse width of the output signal e from the invertor buffer 112 into a signal appearing at (h) in FIG. 4, and hence the output signal from the NAND circuit 114 appears as shown at (i) in FIG. 4.

Figure 5:
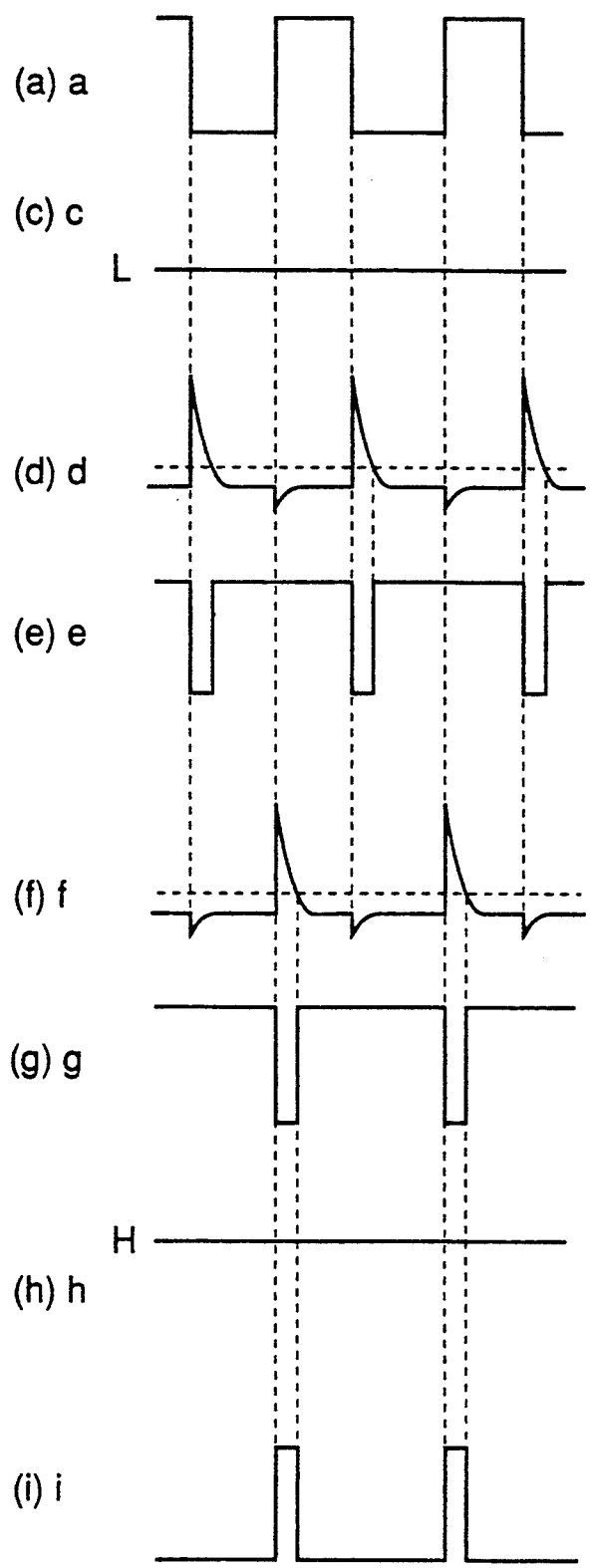
FIG. 5 is a timing chart similar to FIG. 4 in the case where a failsafe operation is performed due to the invertor buffer output being held at a low level.

On the other hand, if the output from the invertor buffer 106 is held at a low level as at (c) in FIG. 5, the output signals from the invertor buffers 112, 113 regularly vary as usual, respectively as shown at (e) and (g) in FIG. 5. Accordingly, the output signal from the NAND circuit 107 appears as shown at (h) in FIG. 5. Therefore, the pulse width of the output signal from the NAND circuit 114 is limited by the pulse width of the output signal g from the invertor buffer 113 into a signal as shown at (i) in FIG. 5. Thus, even when there occurs a large distortion or offset in the waveform of the output voltage, the NAND circuit 114 continues to generate as the PWM signal a pulse train which has a pulse width limited by the minimum pulse width or the maximum pulse width as shown at (i) in FIG. 4 or at (i) in FIG. 5 as long as the superposed signal continuously exceeds or lies below the threshold level. By virtue of this failsafe operation, the invertor device can continue its operation.

Reference is now made to processing of the PWM signal after being outputted from the NAND circuit 114. This PWM signal is fed through the dual invertor buffer 115, amplified by the push-pull amplifier 116, and applied to the capacitor C6 to have their low frequency components removed. Before passing the capacitor C6, the PWM signal has constant amplitude with respect to the reference level but the average voltage (integrated value) of this signal varies with he same period as the sine wave signal from the sine wave generator 102. Therefore, this PWM signal contains a component of the same frequency as that of the sine wave signal (commercial frequency).

Since the capacity C6 does not pass low frequency components, i.e. a commercial frequency component in the present embodiment, but passes only the PWM carrier frequency signal which is high in frequency, the PWM signal, after having passed the capacitor C6, is converted into a pulse train which varies as a whole in reverse phase to the commercial frequency component and always has a zero average voltage as shown at (j) in FIG. 2. This pulse train always having a zero average voltage is applied to the primary coils L3, L4 of the pulse transformers A, C. Therefore, cores of the pulse transformers A, C are almost not magnetically saturated due to the commercial frequency component, making it possible to use small-sized cores without the fear of being magnetically saturated at the PWM carrier frequency.

An output pulse signal, which is almost identical with the signal at (j) in FIG. 2, from the secondary coil of the pulse transformer A is compared with the breakdown voltage of each of the Zener diodes D8, D9 which form a two-way voltage limitter. When the output pulse signal exceeds the corresponding breakdown voltage in the positive direction or the negative direction, the Zener diode D8 or D9 conducts to thereby limit the voltage of the output pulse signal. At the same time, the capacitor C8 is charged or discharged in response to conduction or cutting-off of the Zener diode D8, D9 so that a voltage occurs across the capacitor C8, which is an average voltage of the amounts by which the output pulse signal exceeds the breakdown voltages of the Zener diodes D8, D9, the average voltage having the commercial frequency. Therefore, a signal which is obtained by superposition of the terminal voltage of the capacitor C8 having the commercial frequency and the output pulse signal from the secondary coil of the pulse transformer A, i.e. the PWM signal c before passing the capacitor C6 (at (c) in FIG. 2) is reproduced between the gate and source of the FET Q1. The FET Q conducts while each positive pulse of the PWM signal is applied to its gate.

The constant of the capacitor C8 is set at a value greater than the gate capacitance of the FET Q1, and the constant of the resistance R7 is set at a value corresponding to a Q value at which the pulse transformer A and the capacitor C8 do not resonate. The resistance R8 determines the switching speed of the FET Q1. The diode D7 quickly discharges a charge so far charged in the gate capacitance of the FET Q when voltage applied to the gate of the FET Q1 drops, to thereby immediately cut off the FET Q1.

An output pulse signal from the secondary coil of the pulse transformer C is also processed in the same manner as the output pulse signal from the pulse transformer A. Thus, switching of the FET Q3 takes place at the same timing as the FET Q1 so that upon inputting of each positive pulse of the PWM signal, the FET's Q1 and Q3 conduct simultaneously to cause direct current from the smoothing circuit 4 to be supplied to the low-pass filter 8.

The PWM signal from the NAND circuit 114 is also fed through the invertor buffer 117 and then subjected to signal processing in the same manner as the above described signal circuit from the push-pull amplifier 116 to the FET's Q1, Q3, and switching of the FET's Q2, Q4 is controlled in response to the PWM signal. But, due to the presence of the invertor buffer 117, the PWM signal in this signal circuit is reverse in phase to the PWM signal in the signal circuit from the push-pull amplifier 116 to the FET's Q1, Q3. Consequently, when the FET's Q1, Q3 conduct, the FET's Q2, Q4 are cut off, whereas when the former are cut off, the latter conduct.

As described above, in this embodiment, the invertor 7 carries out switching control based upon a PWM signal which is formed by modulating a sine wave signal having a commercial frequency by a high frequency triangular wave signal, and then a carrier frequency component contained in the switched output from the invertor 7 is removed by the low-pass filter 8, whereby alternating current output having the commercial frequency, which is close in waveform to the sine wave signal is supplied through the output terminals 9, 9' to the load.

Figure 6:
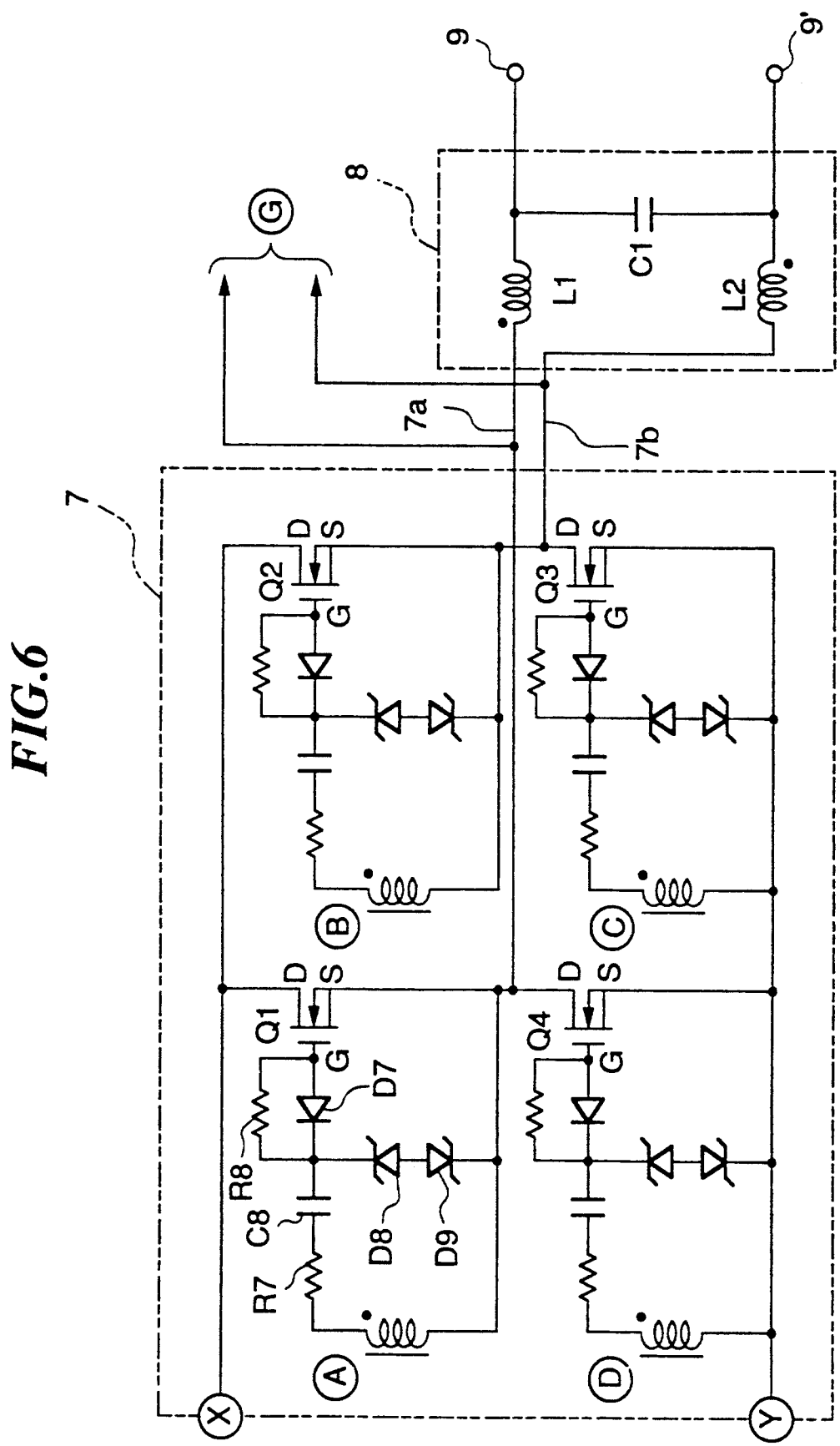
FIG. 6 is a circuit diagram showing an invertor and an output circuit, forming part of an invertor device according to a second embodiment of the invention.

Next, a second embodiment of the invention will be described with reference to FIG. 6. FIG. 6 shows an inventor and an output circuit of the inventor device according to the second embodiment. The other components of the inventor device of this embodiment are identical with those in FIGS. 1a, 1c–1e. This embodiment is distinguished from the first embodiment mainly in that the ends of the series circuit of the resistances R1, R2 and the series circuit of the resistances R3, R4 are connected not to the ends G of the capacitor C1 of the low-pass filter 8 but to the output lines 7a and 7b, i.e. at the input side of the low-pass filter 8.

According to the second embodiment, the output voltage appearing on the output line 7a and the output voltage appearing on the output line 7b (the waveforms of these output voltages have PWM waveforms as shown at (c) in FIG. 2) pass the dividing resistances R1, R2 and R3, R4 to the junction between the capacitor C2 and the resistance R10 and the junction between the capacitor C2 and the resistance R11, respectively. The capacitor C2 acts to remove carrier frequency components of the PWM signal from the output voltages to form respective AC signals similar to those appearing at the output terminals 9 and 9' as AC power unit output AC voltages. The two AC signals are compared with each other by the differential amplifier 101, which detects the difference between the AC signals as an AC signal containing distortions of the waveform and the offset component of the AC power unit output voltage (an AC signal having an average level depending on the distortions in the waveform and the offset component), and amplifies the detected difference signal to supply the amplified signal to the differential amplifier 103. Since the output voltages at the output lines 7a, 7b are thus directly compared with each other, it is possible to accurately detect distortions in the waveform of the AC power unit output voltage. The capacitors C2, C3 and C4 act to remove high frequency components (containing the PWM carrier frequency component) from the difference signal, and at the same time eliminate disturbance which are applied to the differential amplifier 103. Thus, the offset component etc. of the AC power unit output voltage are detected by directly comparing the voltages at the output lines 7a and 7b. As a result, the AC power unit output voltage undergoes less variations due to delay in the phase, which would otherwise be caused by the low-pass filter 8 and depends upon the external load connected to the AC power unit than in the case where the output voltages are detected from the output terminals 9, 9', as in the first embodiment, thus contributing to stabilization of the feedback control operation for removing the offset component etc. from the AC power unit output voltage. Accordingly, the feedback gain of the feedback control system can be increased to make it possible to obtain a waveform of the AC power unit output voltage closer to that of the sine wave.

Further, in the detecting circuit shown in FIG. 1c, the values of resistances R1, R2, R3, and R4 are set such that R1:R2=R3:R4, and the values of the resistances R10 to R14 are set at respective suitable values, to ensure accurate detection of the offset component and distortions in the waveform from the PWM signals at the output lines 7a, 7b.

Figure 7:
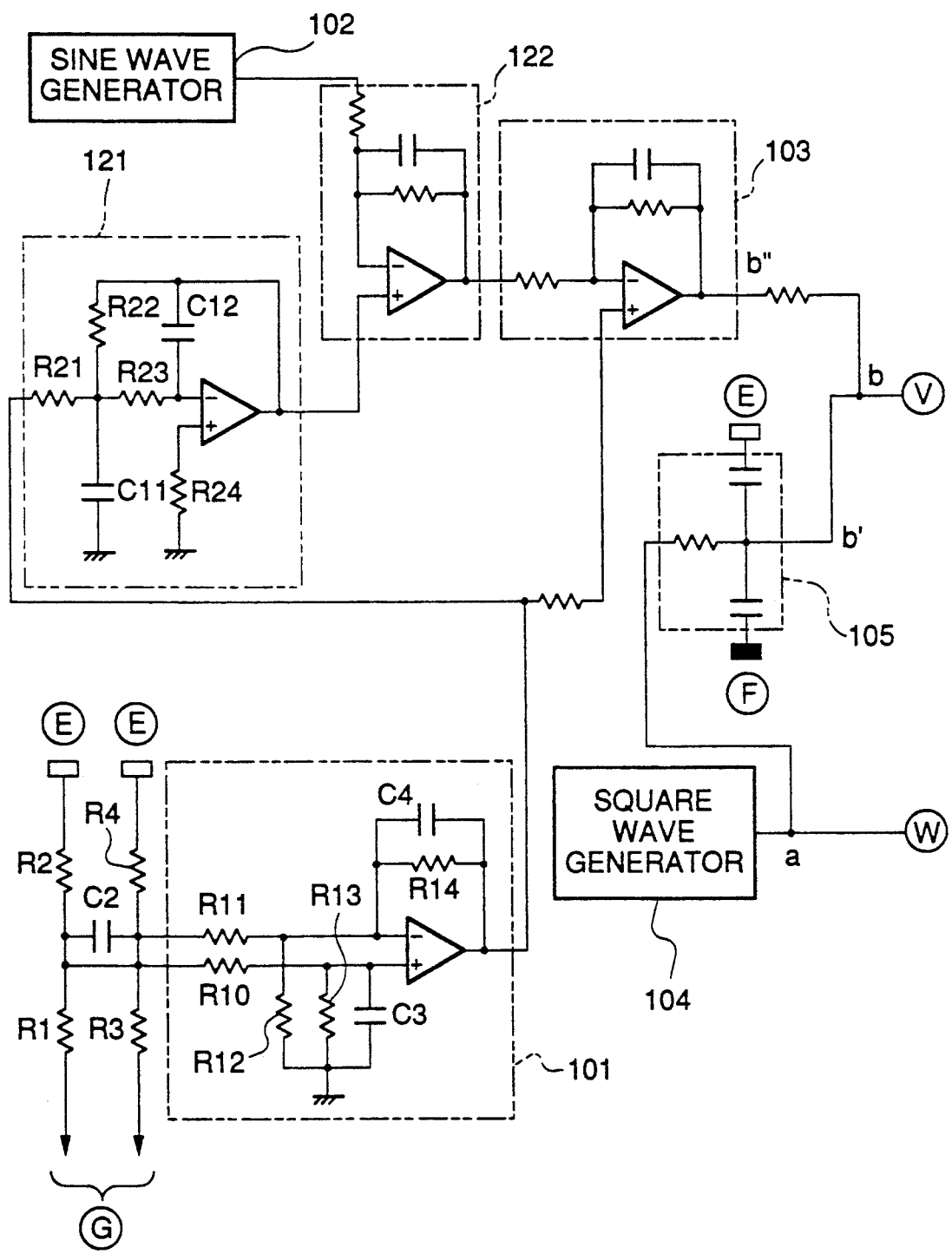
FIG. 7 is a circuit diagram showing a detecting circuit, a sine wave generator, a low-pass filter circuit, differential amplifiers, a square wave generator, and an integrating circuit, forming part of an invertor device according to a third embodiment of the invention.

Next, a third embodiment of the invention will be described with reference to FIG. 7. This embodiment is distinguished from the second embodiment mainly in that a low-pass filter circuit 121 and a differential amplifier 122 are additionaly interposed between the differential amplifier 103, and the sine wave generator 102 and the differential amplifier 101, to form a first waveform-correcting circuit, while the differential amplifier 103 forms a second waveform-correcting circuit. As shown in FIG. 7, the output terminal of the differential amplifier 101 is connected to the low-pass filter circuit 121 and the non-inverting input terminal of the differential amplifier 103.

The low-pass filter circuit 121 is composed of an operational amplifier, resistances R21 to R24, and capacitors C11, C12. The resistance values of the resistances and the capacitance values of the capacitors are set such that the cut-off frequency of this circuit is approximately 5 Hz, to thereby output only a DC component of the input signal. The output terminal of the low-pass filter 121 is connected to the non-inverting input terminal of the differential amplifier 122. The output terminal of the sine wave generator 102 is connected to the inverting input terminal of the differential amplifier 122. The output terminal of the differential amplifier 122 is connected to the inverting input terminal of the differential amplifier 103.

In the third embodiment, the output (i.e. amplified AC signal) from the differential amplifier 101 is supplied to the low-pass filter 121 and the differential amplifier 103.

The differential amplifiers 103, 122 and the low-pass filter circuit 121 are arranged such that they correct the sine wave signal having the commercial frequency generated by the sine wave generator 102, based on the feedback signal outputted from the differential amplifier 101 and containing distortions in the waveform and/or the offset component of the AC power unit output voltage. After the correction, the differential amplifier 103 outputs a sine wave signal b" (at (b") in FIG. 2) having the commercial frequency and corrected with respect to the amplitude reference level by these circuits so as to make the AC power unit output voltage waveform closer to that of a sine wave.

More specifically, the first waveform-correcting circuit comprising the low-pass filter circuit 121 and the differential amplifier 122 takes out and amplifies DC components (lower frequency components) from the output signal (voltage difference signal) from the differential amplifier 101, and effects the offset correction on the output signal (sine wave reference signal) from the sine wave generator 102 in a feedback manner. By this correction, DC offset components of the AC power unit output voltage can be decreased. On the other hand, the differential amplifier 103 as the second waveform-correcting circuit directly feeds the voltage difference signal from the differential amplifier 101 containing AC components (higher frequency components) back to the output signal from the differential amplifier 122 to correct the offset-corrected sine wave reference signal. This correction can reduce distortions in the waveform of the AC power unit output voltage. The provision of the two waveform-correcting circuits have the following advantages:

Unless the first waveform-correcting circuit is provided, a high feedback ratio is required, i.e. the gain of the second waveform-correcting circuit has to be set to a fairly large value, to effect the offset correction or removal of DC components from the AC power unit output voltage. However, if the gain is so large, the feedback gain of higher frequency components is large accordingly, so that abnormal oscillation is liable to occur. If the frequency of the feedback signal is decreased to avoid such oscillation, the effects of the waveform correction largely decrease. In contrast, according to the present embodiment, by virtue of the above-described construction, it is possible to set the total feedback gain of DC components (lower frequency components) to a large value while keeping the feedback gain of higher frequency components at a moderate value, whereby distortions in the waveform and DC offset components of the AC power unit output voltage can be further decreased.

What is claimed is:

1. In an invertor device for an alternating current power unit having a direct current power source circuit, said invertor device including switching means for effecting switching control of an output from said direct current power source circuit, and an output circuit responsive to the switching control of said switching means for supplying an AC power output.

the improvement comprising:
a sine wave-forming circuit for generating a sine wave signal having a predetermined frequency;
a triangular wave-forming circuit for generating a triangular wave signal having a frequency higher than said predetermined frequency;
a superposed signal-forming circuit for superposing said triangular wave signal on said sine wave signal to generate a superposed signal; and
a pulse width modulating circuit comprising an invertor buffer having a predetermined fixed threshold level for amplifying said superposed signal with reference to said predetermined fixed threshold level to generate a pulse width modulated signal;
wherein said switching means performs said switching control based on said pulse width modulated signal from said pulse width modulating circuit.

2. An invertor device according to claim 1, wherein said invertor buffer comprises an integrated circuit, an input terminal of said integrated circuit having a threshold level of a C-MOS gate. threshold level of a C-MOS gate.

3. An invertor device according to claim 1, wherein said triangular wave-forming circuit comprises a rectangular wave-forming circuit for generating a rectangular wave signal having said frequency higher than said predetermined frequency, and an integrating circuit for integrating said rectangular wave signal to form said triangular wave Signal.

4. An invertor device according to claim 4, wherein said rectangular wave signal has a repetition period longer than a response time of said invertor buffer.

5. An invertor device according to any of claims 1 - 4, including a shift-detecting circuit for detecting an amount of shift in a direct current component in an output voltage from said output circuit, and a shift feedback control circuit responsive to the amount of shift detected by said shift-detecting circuit for changing an amplitude reference level of said sine wave signal so as to decrease said amount of shift, to thereby feedback-control said pulse width modulated signal.

6. In an invertor device for an alternating current power unit having a direct current power source circuit, said invertor device including switching means for effecting switching control of an output from said direct current power source circuit, a sine wave-forming circuit for generating a sine wave reference signal having a predetermined frequency, a pulse width modulating circuit for subjecting said sine wave reference signal to pulse width modulation to generate a pulse width modulated signal, a switching control circuit for causing said switching means to perform said switching control based on said pulse width modulated signal from said pulse width modulating circuit, and an output circuit having a pair of output terminals and responsive to said switching control by said switching means for generating an alternating current power output having a sinusoidal waveform via said output terminals, the improvement comprising:
a detecting circuit for comparing between waveforms of output alternating current voltages appearing at said output terminals of said output circuit and effecting differential amplification of said output voltages, to thereby detect a difference between said waveforms of said output alternating current voltages and to generate a signal representing said relative voltage difference; and
a correcting circuit for correcting said sine wave reference signal by said signal from said detecting circuit and then supplying the resulting corrected sine wave reference signal to said pulse width modulating circuit, to thereby correct said waveforms of said output alternating current voltages appearing at said output terminals such that said waveforms become closer to sinusoidal waveforms.

7. An invertor device according to claim 6, wherein said detecting circuit comprises a constant voltage supply source, first and second voltage-dividing resistances connected between said constant voltage supply source and respective ones of said output terminals, a differential amplifier having a pair of input terminals connected to said first and second voltage-dividing resistances to be supplied with respective divided voltages therefrom, and filter means for removing high frequency components from said divided voltages.

8. An invertor device according to claim 6, further comprising a triangular wave-forming circuit for generating a triangular wave signal having a frequency higher than said predetermined frequency of said sine wave reference signal, and a superposed signal-forming circuit for superposing said triangular wave signal on said sine wave reference signal said correcting circuit to form a superposed signal and supply said superposed signal to said pulse width modulating circuit, wherein said pulse width modulating circuit comprises an amplifier circuit having a predetermined fixed threshold level, said amplifier circuit amplifying said superposed signal from said superposed signal-forming circuit to thereby generate said pulse width modulated signal.

9. An invertor device according to any of claims 6 to 8, wherein said correcting circuit comprises a differential amplifier for comparing said sine wave reference signal with said signal from said detecting circuit and amplifying a difference therebetween.

10. In an invertor device for an alternating current power unit having a direct current power source circuit, said invertor device including switching means for effecting switching control of an output from said direct current power source circuit to generate a pair of switched outputs, a sine waveforming circuit for generating a sine wave reference signal having a predetermined frequency, a pulse width modulating circuit for subjecting said sine wave reference signal to pulse width modulation to generate a pulse width modulated signal, a switching control circuit for causing said switching means to perform said switching control based on said pulse width modulated signal from said pulse width modulating circuit, a pair of output lines connected to-an output of said switching means for transmitting said pair of switched outputs from said switching means, a filter circuit connected to said pair of output lines for converting said pair of switched outputs into an alternating current power output having a sinusoidal waveform, and a pair of output terminals connected to said filter circuit for outputting said alternating current power output from said filter circuit, the improvement comprising:

a detecting circuit connected to said pair of output lines for comparing between voltages appearing at each of said pair of output lines and effecting differential amplification of said voltages, to thereby detect a relative voltage difference between said output voltages and generate a signal representing said relative voltage difference; and a correcting circuit for correcting said sine wave reference signal by said signal from said detecting circuit and then supplying the resulting corrected sine wave reference signal to said pulse width modulating circuit, to thereby correct, waveforms of output alternating current voltages appearing at said pair of output terminals such that said waveforms become closer to sinusoidal waveforms.

11. An invertor device according to claim 10, wherein said filter circuit comprises a first low-pass filter circuit including a coil and a capacitor, and said detecting circuit comprises a second low-pass filter circuit including resistances and capacitors removing high frequency components from said pair of switched outputs at said pair of output lines and a differential amplifier for comparing between filtered output voltages from said second low-pass filter circuit and amplifying a difference between said output voltages.

12. An invertor device according to claim 10, further comprising a triangular wave-forming circuit for generating a triangular wave signal having a frequency higher than said predetermined frequency of said sine wave reference signal, and a superposed signal-forming circuit for superposing said triangular wave signal on said sine wave reference signal from said correcting circuit to form a superposed signal and supply said superposed signal to said pulse width modulating circuit, wherein said pulse width modulating circuit comprises an amplifier circuit having a predetermined fixed threshold level, said amplifier circuit amplifying said superposed signal from said superposed signal-forming circuit to thereby generate said pulse width modulated signal.

13. An invertor device according to any one of claims 10 to 12, wherein said correcting circuit comprises a differential amplifier for comparing said sine wave reference signal with said signal from said detecting circuit and amplifying a difference therebetween.

14. In an invertor device for an alternating current power unit having a direct current power source circuit, said invertor device including switching means for effecting switching control of an output from said direct current power source circuit to generate a pair of switched outputs, a sine waveforming circuit for generating a sine wave reference signal having a predetermined frequency, a pulse width modulating circuit for subjecting said sine wave reference signal to pulse width modulation to generate a pulse width modulated signal, a switching control circuit for causing said switching means to perform said switching control based on said pulse width modulated signal from said pulse width modulating circuit, a pair of output lines connected to an output of said switching means for transmitting said pair of switched outputs from said switching means, and an output circuit connected to said pair of output lines for converting said pair of switched outputs into alternating current power output having a sinusoidal waveform and supplying said alternating current power output, the improvement comprising:

a detecting circuit connected to said pair of output lines for detecting a relative voltage difference between voltages appearing at each of said pair of output lines and forming a relative voltage difference signal;

a first waveform-correcting circuit for taking out and amplifying a direct current offset component from said relative voltage difference signal for feeding back said direct current offset component to said sine wave reference signal to thereby perform offset correction thereof; and a second waveform-correcting circuit for feeding back an alternating current component of said relative voltage difference signal to said sine wave reference signal to correct and supply said sine wave reference signal to said pulse width modulating circuit, to thereby correct, in a feedback manner, the waveform of said alternating current power output such that said alternating current power output from said output circuit has a waveform closer to that of a sine wave.

15. An invertor device according to claim 14, wherein said filter circuit comprises a first low-pass filter circuit including a coil and a capacitor, and said detecting circuit, comprises a second low-pass filter circuit including resistances and capacitors removing high frequency components from said pair of switched outputs at said pair of output lines and a differential amplifier for comparing between filtered output voltages from said second low-pass filter circuit and amplifying a difference between said output voltages.

16. An invertor device according to claim 14 or 15, further comprising a triangular wave-forming circuit for generating a triangular wave signal having a frequency higher than said predetermined frequency of said sine wave reference signal, and a superposed signal-forming circuit for superposing said triangular wave signal on said sine wave reference signal from said second waveform-correcting circuit to form a superposed signal and supply said superposed signal to said pulse width modulating circuit, wherein said pulse width modulating circuit comprises an amplifier circuit having a predetermined fixed threshold level, said amplifier circuit amplifying said superposed signal from said superposed signal-forming circuit to thereby generate said pulse width modulated signal.

* * * * *

UNITED STATES PATENT AND TRADEMARK OFFICE
CERTIFICATE OF CORRECTION

PATENT NO. : 5,309,345
DATED : May 3, 1994
INVENTOR(S) : NAKAMURA et al

It is certified that error appears in the above-indentified patent and that said Letters Patent is hereby corrected as shown below:

In the Title Page, item [57] ABSTRACT, line 9,

Change "modulalted" to --modulated--;

Column 15, line 36, after "output",

Change "." to --,--;

Column 15, line 57-58, after "gate." (first occurrence),

Delete "threshold level of a C-MOS gate.";

Column 15, line 65, "Signal" should be --signal--;

Column 15, line 66, "claim 4" should be --claim 3--;

Column 18, line 47, after "circuit", delete ","

Signed and Sealed this

Ninth Day of January, 1996

Attest:

BRUCE LEHMAN

*Attesting Officer*  *Commissioner of Patents and Trademarks*